(12) United States Patent
Kalz et al.

(10) Patent No.: US 9,021,887 B2
(45) Date of Patent: May 5, 2015

(54) MICROMECHANICAL SEMICONDUCTOR SENSING DEVICE

(75) Inventors: Franz-Peter Kalz, Regensburg (DE);
Horst Theuss, Wenzenbach (DE);
Bernhard Winkler, Regensburg (DE);
Khalil Hosseini, Weihmichl (DE);
Joachim Mahler, Regensburg (DE);
Manfred Mengel, Bad Abbach (DE)

(73) Assignee: Infineon Technologies AG, Neubiberg (DE)

( * ) Notice: Subject to any disclaimer, the term of this patent is extended or adjusted under 35 U.S.C. 154(b) by 438 days.

(21) Appl. No.: 13/329,618

(22) Filed: Dec. 19, 2011

(65) Prior Publication Data

US 2013/0152696 A1    Jun. 20, 2013

(51) Int. Cl.
*G01B 7/16* (2006.01)
*B81B 7/02* (2006.01)
*G01L 9/00* (2006.01)
*G01L 19/00* (2006.01)

(52) U.S. Cl.
CPC ........... *B81B 7/02* (2013.01); *B81B 2201/0235* (2013.01); *B81B 2201/0264* (2013.01); *B81C 2203/0154* (2013.01); *G01L 9/0072* (2013.01); *G01L 19/0092* (2013.01)

(58) Field of Classification Search
CPC ............ G01L 1/22; B81B 3/00; B81B 3/0067
USPC .............................................. 73/760, 777, 780
See application file for complete search history.

(56) References Cited

U.S. PATENT DOCUMENTS

| | | | | |
|---|---|---|---|---|
| 4,410,871 | A * | 10/1983 | Mallon et al. | 338/5 |
| 4,948,757 | A * | 8/1990 | Jain et al. | 438/52 |
| 5,167,158 | A * | 12/1992 | Kamachi et al. | 73/721 |
| 6,474,162 | B1 * | 11/2002 | Voss et al. | 73/504.16 |
| 7,451,656 | B2 * | 11/2008 | Yokoyama et al. | 73/754 |
| 7,775,117 | B2 * | 8/2010 | Kurtz | 73/721 |
| 8,429,977 | B2 * | 4/2013 | Ahles et al. | 73/721 |
| 8,570,637 | B2 * | 10/2013 | Conrad et al. | 359/290 |
| 2002/0179563 | A1 * | 12/2002 | Horning et al. | 216/2 |
| 2005/0115321 | A1 * | 6/2005 | Benzel et al. | 73/514.16 |
| 2006/0289415 | A1 * | 12/2006 | Muehlheim et al. | 219/209 |
| 2010/0171153 | A1 * | 7/2010 | Yang | 257/254 |

FOREIGN PATENT DOCUMENTS

WO    WO-2009083328 A1    7/2009

\* cited by examiner

*Primary Examiner* — Max Noori
(74) *Attorney, Agent, or Firm* — Slater & Matsil, L.L.P.

(57) ABSTRACT

Micromechanical semiconductor sensing device comprises a micromechanical sensing structure being configured to yield an electrical sensing signal, and a piezoresistive sensing device provided in the micromechanical sensing structure, said piezoresistive sensing device being arranged to sense a mechanical stress disturbing the electrical sensing signal and being configured to yield an electrical disturbance signal based on the sensed mechanical stress disturbing the electrical sensing signal.

3 Claims, 8 Drawing Sheets

MICROMECHANICAL SEMICONDUCTOR SENSING DEVICE

FIELD OF THE INVENTION

The invention relates to a micromechanical semiconductor sensing device and a method for manufacturing such a device. In particular, the invention relates to a micromechanical semiconductor pressure sensing device and a method for manufacturing such a device.

BACKGROUND

In applications which involve low costs and the smallest possible space requirement, such as pressure sensors, microphones or acceleration sensors, miniaturized micromechanical semiconductor sensing devices are needed.

As to such micromechanical semiconductor sensing devices, the mechanical disturbance stress acting on the device has an important influence on the electrical output characteristic. The tensions within the packaging material (e.g. mold compound) itself may be one possible reason for mechanical disturbance stress. In particular, this problem appears with different temperatures, because the mechanical disturbance stress varies strongly with the temperature.

Appropriate measures for solving this problem are not known so far.

SUMMARY

An embodiment of the present invention provides a micromechanical semiconductor sensing device, comprising a micromechanical sensing structure yielding an electrical sensing signal, and a piezoresistive sensing device provided in the micromechanical sensing structure, said piezoresistive sensing device being arranged to sense a mechanical stress disturbing the electrical sensing signal thereby yielding an electrical disturbance signal.

Another embodiment of the present invention provides a method for manufacturing such a micromechanical semiconductor sensing device, comprises the following steps: structuring a micromechanical sensing structure for yielding an electrical sensing signal, and providing at least one piezoresistive sensing device in the micromechanical sensing structure, the piezoresistive sensing device being arranged to sense a mechanical stress disturbing the electrical sensing signal thereby yielding an electrical disturbance signal.

BRIEF DESCRIPTION OF THE DRAWINGS

Examples of the present invention will now be described in detail with the accompanying drawings, in which.

DETAILED DESCRIPTION

Figure 1A:
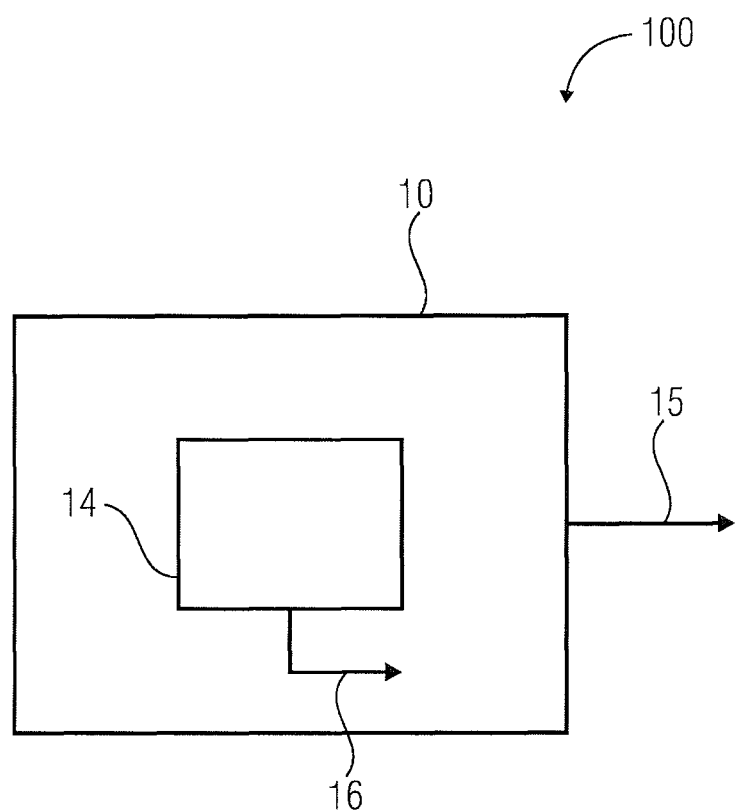
FIG. 1a shows a block diagram of a micromechanical semiconductor sensing device according to an embodiment of the present invention.

FIG. 1a shows a block diagram of a micromechanical semiconductor sensing device 100 according to an embodiment of the present invention.

The micromechanical semiconductor sensing device 100 comprises a micromechanical sensing structure 10 configured to yield (or provide) an electrical sensing signal 15. The electrical sensing signal 15 may describe an external force on the micromechanical semiconductor sensing device 100, which is to be sensed with the micromechanical semiconductor sensing device 100. Furthermore, the micromechanical semiconductor sensing device 100 comprises a piezoresistive sensing device 14 provided in the micromechanical sensing structure 10. The piezoresistive sensing device 14 is arranged to sense a mechanical stress disturbing the electrical sensing signal 15 and is configured to yield (or provide) an electrical disturbance signal 16, based on the sensed mechanical stress disturbing the electrical sensing signal 15.

The micromechanical semiconductor sensing device 100 enables that both the electrical sensing signal 15 and the electrical disturbance signal 16 can be collected within the micromechanical sensing structure 10. Hence, the mechanical disturbance stress which is measured by the piezoresistive sensing device 14 is actually the mechanical disturbance stress acting on the micromechanical sensing structure 10, which disturbs the electrical sensing signal 15. Hence, the micromechanical semiconductor sensing device 100 enables not only a precise measurement of the electrical sensing signal 15 but also of the disturbance in this electrical sensing signal 15. Hence, the disturbance in the electrical sensing signal 15 can be compensated or eliminated based on the measured electrical disturbance signal 16. Furthermore, as the piezoresistive sensing device 14 is provided (e.g. integrated or buried) in the micromechanical sensing structure 10 even variations of the mechanical disturbance stress caused by temperature variations can be sensed and compensated, due to the fact that both the piezoresistive sensing device 14 and the micromechanical sensing structure 10 are subjected to the same temperature variations.

Hence, the micromechanical semiconductor sensing device 100 has a reliable protection against the mechanical disturbance stress acting on such micromechanical semiconductor sensing device 100.

The micromechanical sensing structure 10 may be integrated on a chip.

Figure 1B:
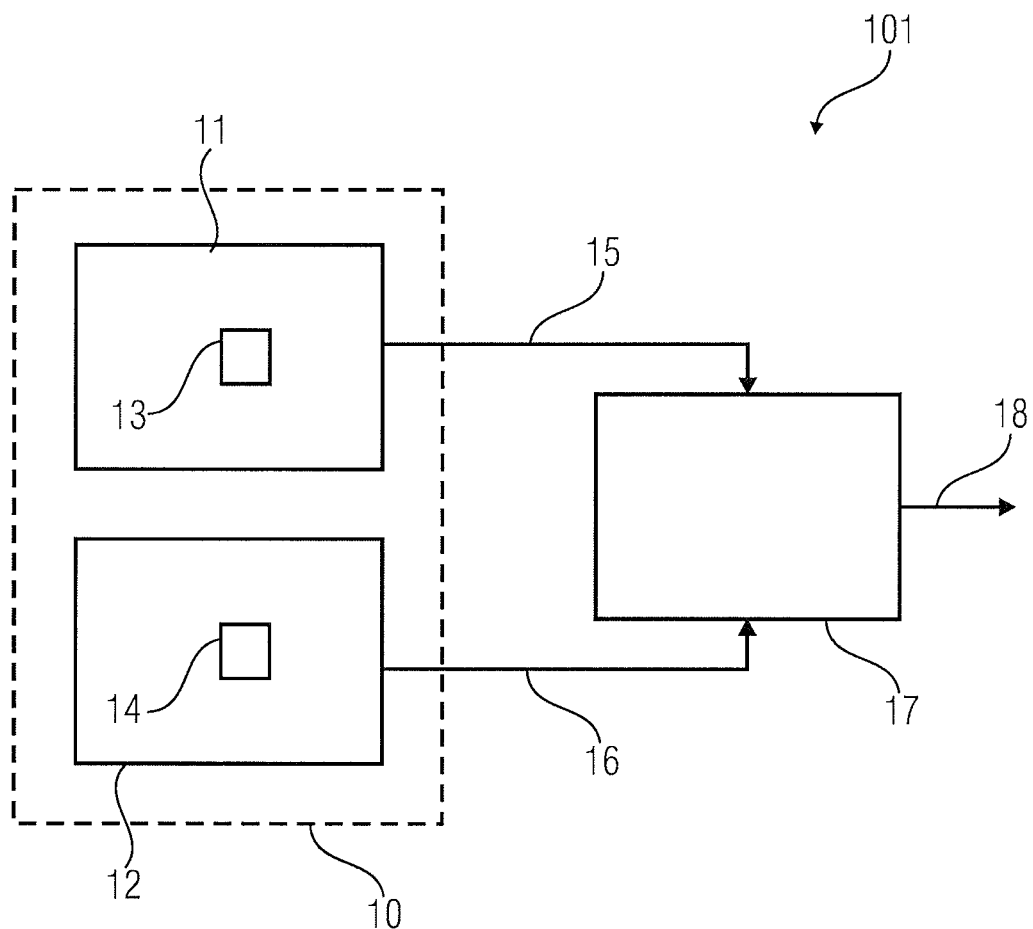
FIG. 1b shows a block diagram of a micromechanical semiconductor sensing device according to a further embodiment of the present invention.

FIG. 1b shows a block diagram of a micromechanical semiconductor sensing device 101 according to a further embodiment of the present invention.

The micromechanical semiconductor sensing device 101 differs from the micromechanical semiconductor sensing device 100 in that the micromechanical sensing structure 10 comprises a sensing element 11 which is configured to yield, for example, via an electrical element 13 the electrical sensing signal 15.

For example, the sensing element 11 can be a movable (pressure) diaphragm of a capacitive pressure sensor or a movable (acceleration) diaphragm of an acceleration sensor.

Furthermore, there is shown a stress element 12 which is subject of mechanical disturbance stress. The piezoresistive sensing device 14 is buried in the stress element 12 and is configured to yield the electrical disturbance signal 16.

The piezoresistive sensing device 14 may be e.g. a piezoresistor or a stress-sensitive transistor.

According to some embodiments of the present invention the micromechanical sensing structure 10 comprises elements which are part of the micromechanical semiconductor sensing device and which are used to convert an external selective force into the electrical sensing signal 15. As an example, the micromechanical sensing structure 10 can comprise or constitute a sensor (e.g. the sensing element 11), which is configured to convert an external selective force into the electrical sensing signal 15. According to embodiments such a sensor may be a pressure sensor, a microphone or an acceleration sensor or any other sensor being capable of converting external selective forces into electrical sensing signals.

It is possible but not necessary that the sensing element 11 and the stress element 12 constitute the same element. For example, the sensing element 11 can be a movable diaphragm of a capacitive pressure sensor or a movable diaphragm of an acceleration sensor, wherein at the same time the movable diaphragm is used as the stress element 12 which is subject of mechanical disturbance stress. The piezoresistive sensing device can be placed in the middle of the diaphragm such that the piezoresistive sensing device senses as little as possible from the external selective force to be measured but as much as possible from the mechanical disturbance stress.

Furthermore, the micromechanical semiconductor sensing device 101 comprises a compensation logic 17 which is configured to compensate, based on the electrical disturbance signal 16, a disturbance in the electrical sensing 15 signal caused by the mechanical stress. Or in other words, the electrical disturbance signal 16 of the piezoresistive sensing device 14 is used by the compensation logic 17 to eliminate the electrical component of mechanical stress disturbing the electrical sensing signal 15. As an example, the compensation logic 17 may be configured to generate an output signal 18 based on a combination of the electrical sensing signal 15 and the electrical disturbance signal 16. The resulting output signal 18 is less influenced by the mechanical disturbance stress than the electrical sensing signal 15 alone. As an example, the compensation logic 17 may be configured to subtract the electrical disturbance signal 16 from the electrical sensing signal 15, to remove the disturbance caused by mechanical stress from (or at least to reduce the disturbance caused by mechanical stress in) the electrical sensing signal 15. Hence, the micromechanical semiconductor sensing device 101 enables that the electrical sensing signal 15 is a more precise representation of the external selective force measured by the sensing element 11 than with known sensing devices possible.

To summarize, at an output of the calibration logic 17 there is the output signal 18 which constitutes now an improved signal and which is less influenced by the mechanical disturbance stress.

The calibration logic 17 may be initialized during the calibration of the micromechanical semiconductor sensing device.

Having a capacitive pressure sensor, for example, it is possible to expose the pressure sensor in a pressure chamber to various pressures. For each pressure, the capacity of the diaphragm is measured. The resulting measurement signals can be used to determine calibration coefficients which can be stored in an internal storage of the pressure sensor.

The calibration both of the electrical sensing signal 15 and of the electrical disturbance signal 16 can be achieved by exposing the pressure sensor to various temperatures and pressures. The result is an identification field for different pressures and different temperatures. Now, the resulting measurement signals both of the electrical sensing signal 15 and the electrical disturbance signal 16 can be used to determine a two-dimensional field of calibration coefficients which can be stored in an internal storage of the pressure sensor.

Figure 2A:
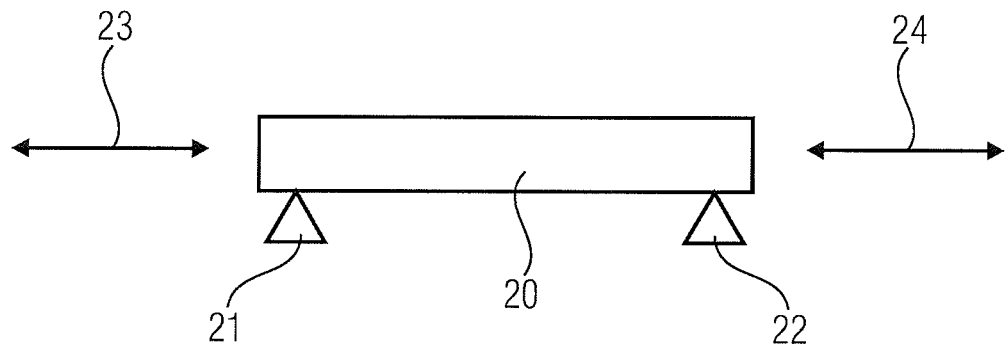
FIG. 2a shows a schematic view of an element of a micromechanical sensing structure which is subject to mechanical disturbance stress.

FIG. 2a shows a schematic view of an element of a micromechanical sensing structure which is subject to mechanical disturbance stress. The element 20 is supported by a support structure 21, 22. Mechanical disturbance stress acts on the element 20 in the directions 23, 24 and causes internal tensions within the element 20.

Figure 2B:
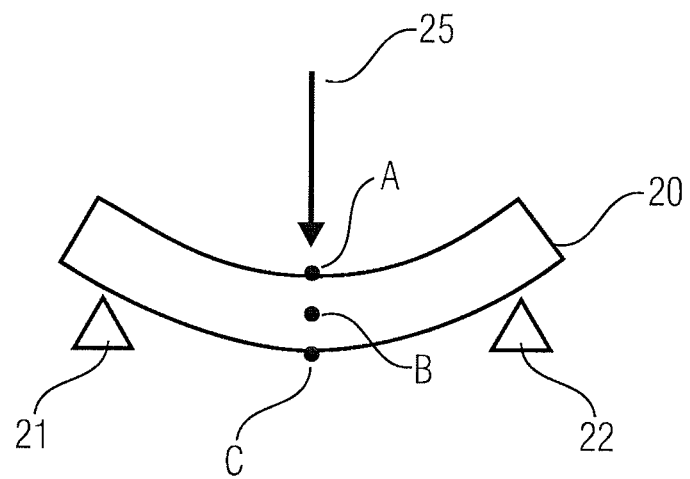
FIG. 2b shows a schematic view of an element of a micromechanical sensing structure which is subject to an external selective force.

FIG. 2b shows a schematic view of an element of a micromechanical sensing structure which is subject to an external selective force. The element 20 is again supported by a support structure 21, 22. Now, an external selective force 25 acts on the element 20 and causes a deformation of the element 20. The deformation can be measured by a piezoresistive sensing device wherein the piezoresistive sensing device can have e.g. the positions A, B or C. In reaction of the external selective force 25, a piezoresistive sensing device measures in position A a compression and in position C an expansion. However, a measurement in position B is virtually not influenced by the external selective force 25. Nevertheless, a measurement in position B can still measure mechanical disturbance stress as shown in FIG. 2a.

Hence, it is possible to position a piezoresistive sensing device according to the invention in an element of a micromechanical sensing structure which selectively measures mechanical disturbance stress without being influenced by an external selective force which yields the actual electrical sensing signal of the micromechanical sensing structure.

Figure 3:
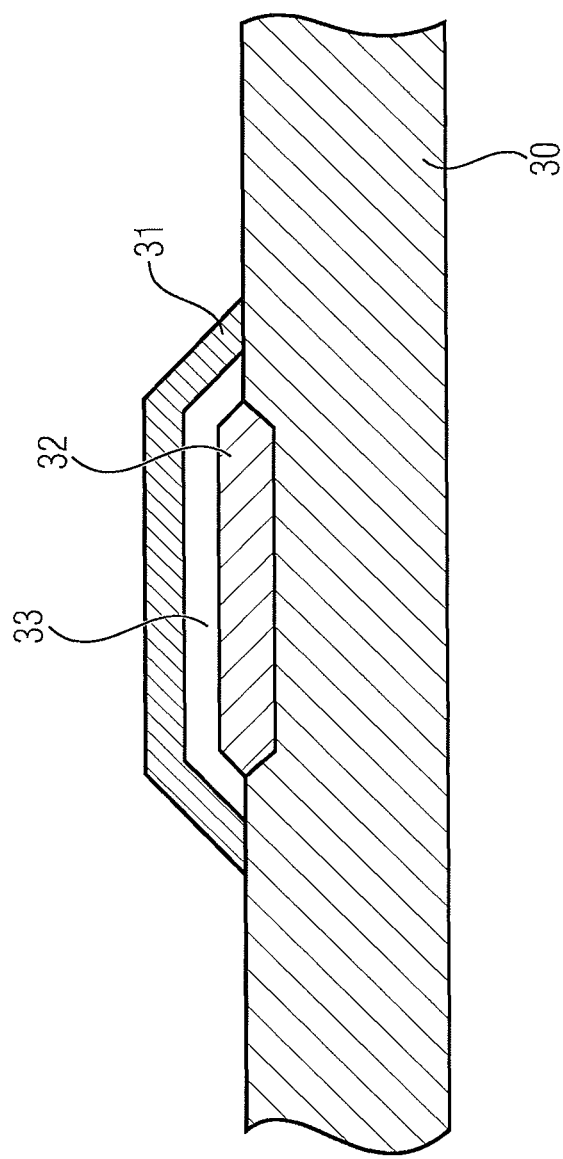
FIG. 3 shows a schematic view of the micromechanical sensing structure of a capacitive pressure sensor.

FIG. 3 shows a schematic view of the micromechanical sensing structure of a capacitive pressure sensor. The micromechanical sensing structure is mounted on a substrate 30. Usually, the substrate 30 is made of silicon. On the silicon substrate, a movable diaphragm 31 is shaped by a plurality of masking and etching steps. The movable diaphragm 31 is conductive or has at least a conductive coating on its surface. This conductive coating is connected via conductor lines with a measurement electronic. On the opposite side of the movable diaphragm 31 there is an electrode 32 made of a conductive coating, e.g. a metal or an alloy. The electrode 32 is also connected via conductor lines with the measurement electronic. For example, the measurement electronic can be integrated on the silicon substrate 30.

An external selective force acting on the movable diaphragm 31 causes a deformation. Accordingly, the height of the hollow space 33 will be increased or decreased. The movable diaphragm 31 and the electrode 32 constitute together a plate capacitor. The capacity of the plate capacitor depends on the distance between the movable diaphragm 31 and the electrode 32. Hence, by measuring the capacity by means of a measurement electronic, the external selective force (pressure, acceleration of a test mass, etc.) acting on the movable diaphragm 31 can also be measured.

Figure 4:
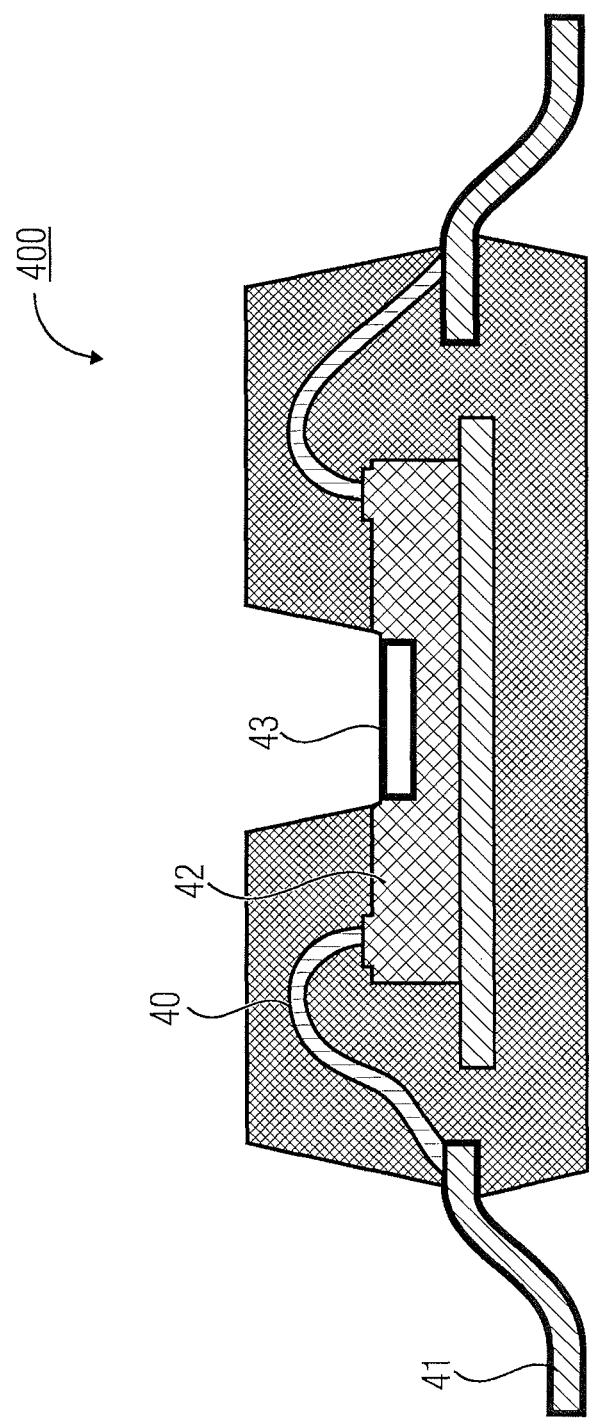
FIG. 4 shows a schematic view of a micromechanical semiconductor sensing device according to an embodiment of the present invention.

FIG. 4 shows a schematic view of a micromechanical semiconductor sensing device 400 according to an embodiment of the present invention. The micromechanical semiconductor sensing device 400 comprises a housing 40, pins 41 and a chip substrate 42. Furthermore, a micromechanical sensing structure 43 is mounted on the chip substrate 42.

Figure 5A:
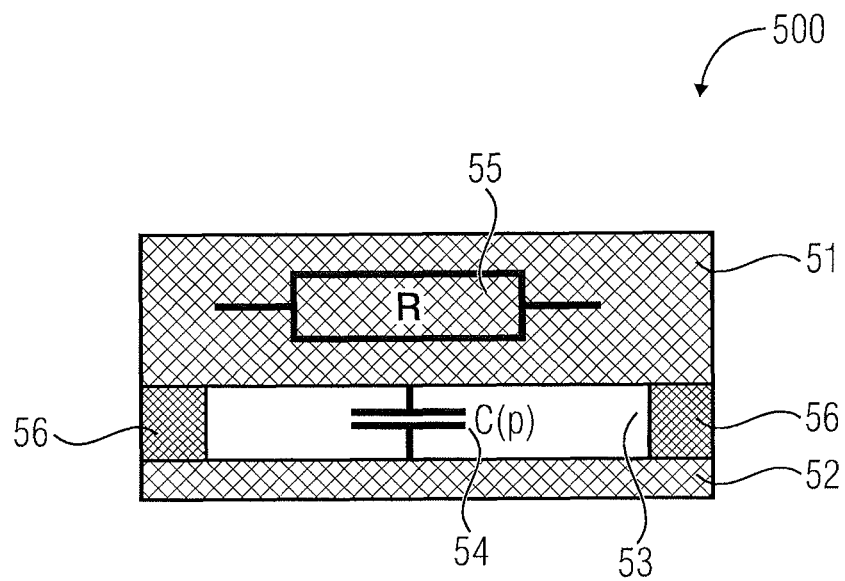
FIG. 5a shows a schematic view of a pressure sensing device according to an embodiment of the present invention.

FIG. 5a shows a schematic view of a pressure sensing device 500 according to the present invention. As an example, the pressure sensing device 500 may be an implementation of the micromechanical semiconductor sensing device 100 or the micromechanical semiconductor sensing device 101.

Hence, the pressure sensing device 500 includes a movable diaphragm 51 and a supporting structure made of a silicon substrate (not shown). Arranged above the substrate is a silicon counterelectrode 52. The counterelectrode 52 and the diaphragm 51 form a cavity 53 between the diaphragm 51 and the counterelectrode 52. The counterelectrode 52 and the diaphragm 51 are designed to be conductive by suitable doping of the silicon and are isolated from each other by an isolator 56 (e.g. by an isolation layer 56). Hence, the diaphragm 51, counterelectrode 52, and the cavity 53 create a capacitor structure 54, with the counterelectrode 52 and the diaphragm 51 acting as "capacitor plates" and the cavity 53 acting as dielectric.

If the diaphragm 51 is exited to vibrate, the capacitance of the capacitor structure 54 changes. The capacitance may be determined with the aid of metal contacts arranged on the top of the structure.

As an example, the sensing element 11 may be connected to the diaphragm 51 and the counterelectrode 52 and may be configured to sense the capacitance of the capacitor structure 54 and to derive the electrical sensing signal 15 based on the sensed capacitance of the capacitor structure 54.

The diaphragm material can be monocrystalline silicon.

In the middle of the diaphragm 51 a piezoresistor 55 is buried which is configured to yield the electrical disturbance signal 16. In other words, in the embodiment shown FIG. 5a, the piezoresisitve sensing device 14 comprises or constitutes the piezoresistor 55. Piezoresistors can be built into any rigid or flexible monocrystalline silicon structure, making the measurement of strain in the structure possible.

As explained according to FIG. 2a and FIG. 2b, the piezoresistor 55 (or piezoresisitve sensing device 14) can be placed in the diaphragm 51 such to measure selectively the mechanical disturbance stress acting on the pressure sensing device 500 whereas the external pressure acting on the movable diaphragm 51 is measured based on variation of the capacitance of capacitor structure 54 by the sensing element 11.

Figure 5B:
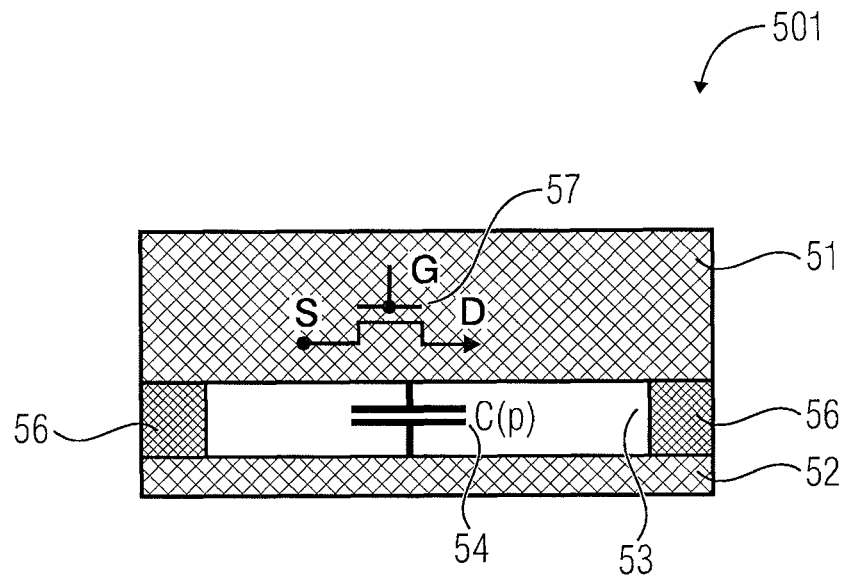
FIG. 5b shows a schematic view of a pressure sensing device according to a further embodiment of the present invention.

FIG. 5b shows a schematic view of a pressure sensing device 501 according to the present invention. As an example, the pressure sensing device 501 may be another implementation of the micromechanical semiconductor sensing device 100 or the micromechanical semiconductor sensing device 101.

The pressure sensing device 501 differs from the pressure sensing device 500 in that a stress sensitive transistor 57 is used instead of the piezoresistor 55. Otherwise, the explanations of FIG. 5a apply also to FIG. 5b, wherein the same reference signs are used for the elements.

Figure 6A:
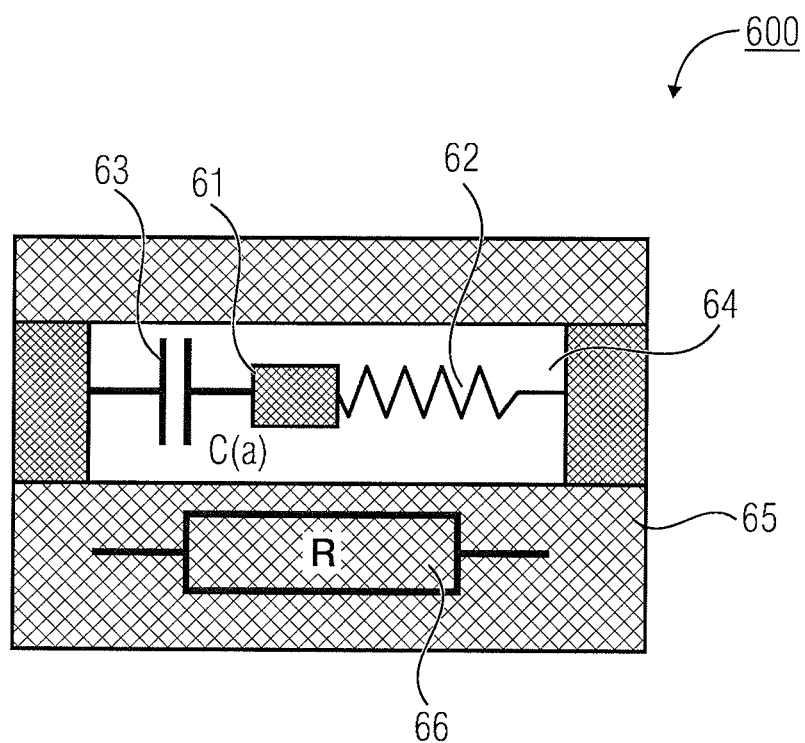
FIG. 6a shows a schematic view of an acceleration sensing device according to an embodiment of the present invention.

FIG. 6a shows a schematic view of an acceleration sensing device 600 according to the present invention. As an example, the pressure sensing device 600 may be another implementation of the micromechanical semiconductor sensing device 100 or the micromechanical semiconductor sensing device 101

In principle, the acceleration is measured by a test mass 61 which is mounted on a spring 62, wherein the movement of the test mass is measured by a change of the capacitance of a capacitor 63 within a cavity 64. As example, the sensing 11 element may be configured to measure the change of the capacitance of the capacitor 63, to derive the electrical sensing signal 15.

To achieve this, the acceleration sensing device 600 can be realized by a deflectable pressure measuring diaphragm and a counter-structure. The test mass is connected 61 to the pressure measuring diaphragm in order to be deflected from an idle position depending on an acceleration applied. The deflection of the mass results in a change of the distance between the pressure measuring diaphragm and the counter-structure, which is detectable by a change of the capacitance of the capacitor 63.

Furthermore, the cavity 64 is supported by a support structure 65. In the middle of the support structure 65, a piezoresistor 66 is buried yielding the electrical disturbance signal 16. Hence in the embodiment shown in FIG. 6a, the piezoresisitve sensing device 14 comprises or constitutes the piezoresistor 66.

As explained according to FIG. 2a and FIG. 2b, the piezoresistor 66 can be placed in the support structure 65 such to measure selectively the mechanical disturbance stress acting on the acceleration sensing device 600 whereas the acceleration acting on the test mass 61 is measured based on a change of the capacitance of the capacitor 63 by the sensing element 11.

Figure 6B:
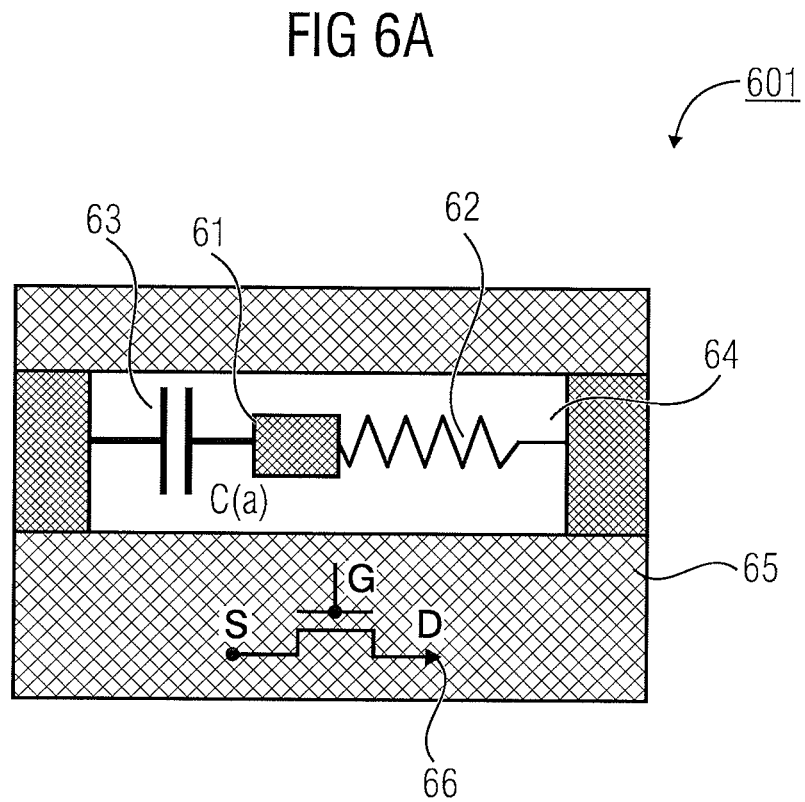
FIG. 6b shows a schematic view of an acceleration sensing device according to a further embodiment of the present invention.

FIG. 6b shows a schematic view of an acceleration sensing device 601 according to the present invention. As an example, the pressure sensing device 601 may be another implementation of the micromechanical semiconductor sensing device 100 or the micromechanical semiconductor sensing device 101. The acceleration sensing device 600 differs from the acceleration sensing device 601 in that a stress sensitive transistor 67 is used instead of the piezoresistor 66. Otherwise, the explanations of FIG. 6a apply also to FIG. 6b, wherein the same reference signs are used for the elements.

Figure 7:
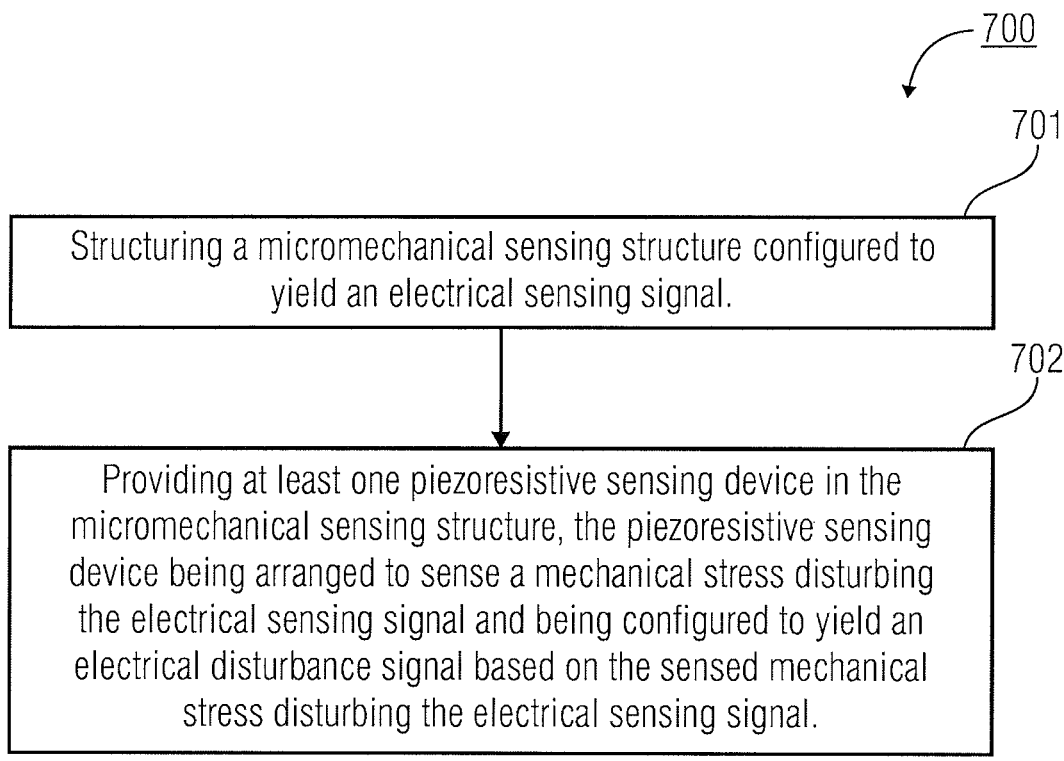
FIG. 7 shows a flow diagram of a method for manufacturing a micromechanical semiconductor sensing device according to an embodiment of the present invention.

FIG. 7 shows a flow diagram of a method 700 for manufacturing a micromechanical semiconductor sensing device according to an embodiment of the present invention.

The method 700 comprises a step 701 of structuring a micromechanical sensing structure configured to yield an electrical sensing signal.

Furthermore the method 700 comprises a step 702 of providing at least one piezoresistive sensing device in the micromechanical sensing structure, the piezoresistive sensing device being arranged to sense a mechanical stress disturbing the electrical sensing signal and being configured to yield an electrical disturbance signal based on the sensed mechanical stress disturbing the electrical sensing signal.

Figure 8:
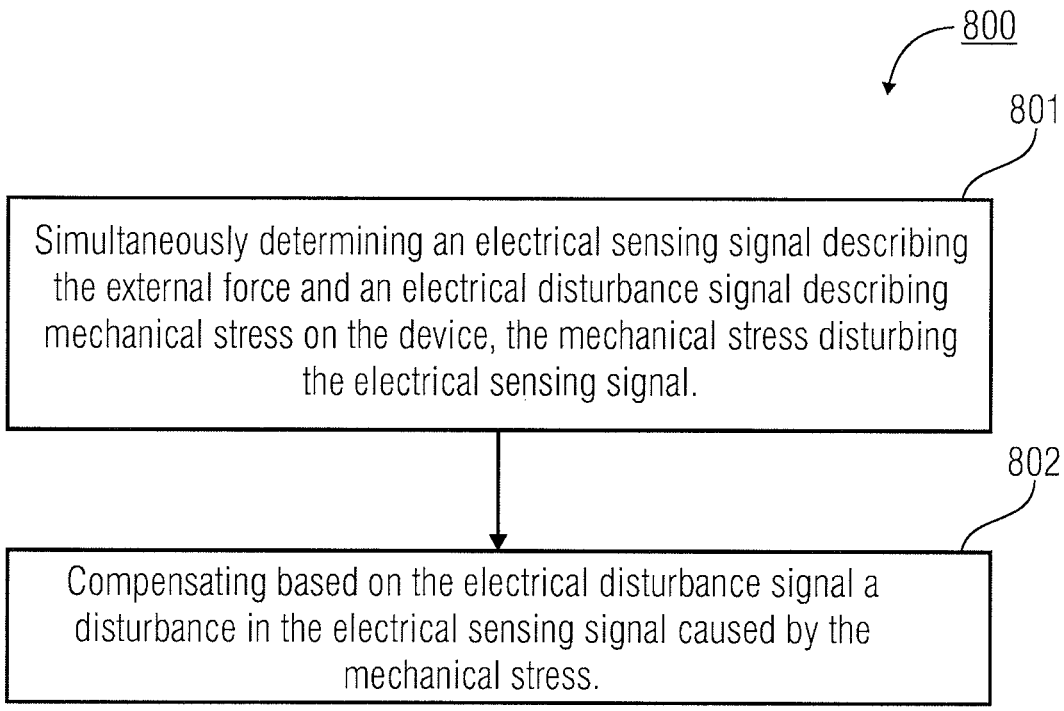
FIG. 8 shows a block diagram of a method for sensing an external force on a device according to a further embodiment of the present invention.

FIG. 8 shows a block diagram of a method 800 for sensing an external force on a device according to a further embodiment of the present invention.

The method 800 comprises a step 801 of simultaneously determining an electrical sensing signal describing the external force and an electrical disturbance signal describing mechanical stress on the device, the mechanical stress disturbing the electrical sensing signal.

Furthermore, the method 800 comprises a step 802 of compensating based on the electrical disturbance signal a disturbance in the electrical sensing signal caused by the mechanical stress.

The method 800 may be performed by embodiments of the present invention, e.g. by the micromechanical semiconductor sensing device 101.

The method 800 may be supplemented by any features of the apparatuses described herein.

To summarize, some embodiments of the present invention provide a micromechanical semiconductor sensing device and a method for manufacturing such a device with an additional measurement of the mechanical stress acting on the device. To achieve this, some embodiments provide a piezoresistive sensing device in the micromechanical sensing structure, said piezoresistive sensing device being arranged to sense a mechanical stress disturbing the electrical sensing signal thereby yielding an electrical disturbance signal.

According to further embodiments, the piezoresistive sensing device is arranged such to sense as little as possible from the quantity to be measured but as much as possible from the mechanical disturbance stress. It is also possible to provide several piezoresistive sensing devices at appropriate locations within the micromechanical sensing structure.

According to further embodiments, the piezoresistive sensing device is a piezoresistor or a stress-sensitive transistor. Piezoresistors can be built into any rigid or flexible single-crystal silicon structure, making the measurement of strain in the structure possible. The same applies for stress-sensitive transistors.

According to further embodiments, the electrical disturbance signal of the piezoresistive sensing device is used by a compensation logic to eliminate the mechanical stress disturbing the electrical sensing signal.

According to further embodiments, the micromechanical sensing structure constitutes a capacitive pressure sensor with a movable diaphragm above a hollow space. For example, the piezoresistive sensing device is buried in the diaphragm.

According to further embodiments, the micromechanical sensing structure constitutes an acceleration sensing device with an inertial element inside a cavity, wherein the cavity is supported by a support structure. For example, the piezoresistive sensing device is buried in the support structure.

Some aspects of embodiments of the present invention shall be summarized in the following.

Embodiments of the present invention solve the problem that a mechanical disturbance stress on a semiconductor sensing device can vary very strongly for different temperatures by providing at every sensing cell (e.g. at every sensing element 11), e.g. a capacitive pressure diaphragm, an additional stress compensation by means of a piezoresistive sensing cell (e.g. the piezoresistive sensing device 14, e.g. the piezoresistive transistor 57, 67 or the piezoresistor 55, 66). The additional information of the piezoresistive signal (e.g. the electrical disturbance signal 16), which is based on temperature variable mechanical stresses, can be used for eliminating parasitic influences by means of the compensation logic 17.

In some embodiments of the present invention the electrical compensation, e.g. at a capacitive pressure sensor, is achieved by implementing the piezoresistive transistor or the piezoresistor in a pressure diaphragm (e.g. the pressure diaphragm 51, 65) or the pressure diaphragms of the capacitive pressure sensor. Based on the electrical signals of the piezoresistive part (e.g. based on the electrical disturbance signal 16) mechanical stresses which have a massively negative influence on the calibration of the sensor can be determined additionally to the capacitive part (e.g. the electrical sensing signal 15). Some embodiments of the present invention are configured to determine for every time the electrical sensing signal 15 (the capacitive part) is determined simultaneously the electrical disturbance signal 16 (the piezoresistive part) directly at the sensing element 11 (e.g. at the pressure diaphragm). The additional information of the piezoresistive signal (of the electrical disturbance signal 16) can be used for eliminating parasitic influences by means of the compensation logic 17.

According to some embodiments of the present invention a pressure diaphragm (e.g. the sensing element 11) and the piezoresistive elements (e.g. the piezoresistive sensing device 14) may comprise monocrystalline silicon or even may be constituted of monocrystalline silicon. A piezoresistive or stress sensitive transistor (e.g. the transistor 57, 67) can be formed by means of implants. Low ohmic terminals can be formed, for example, by means of silicid.

According to some embodiments of the present invention the piezoresistive sensing device 14 (e.g. the mentioned piezoresistor or the mentioned stress sensitive transistor) may be placed in different depths of the diaphragm (e.g. in the middle of the diaphragm) for minimizing the piezoresistive part of the electrical disturbance signal 16 which is based on a deflection of the diaphragm (caused by pressure variations) which is in this case not relevant to the sensing.

According to further embodiments of the present invention a micromechanical semiconductor sensing device may comprise a plurality of piezoresistive sensing devices which are arranged at different positions in the micromechanical sensing structure (e.g. at different positions of the sensing element 11).

Hence, some embodiments of the present invention comprise in every micromechanical sensing structure (e.g. in every pressure diaphragm cell) an additional stress sensitive transistor or piezoresistor for detection of mechanical stress. The stress sensitive transistor or piezoresistor can be connected to a compensation logic such that parasitic stress influences (e.g. the mechanical stress disturbing the electrical sensing signal) on the electrical sensing signal can be eliminated (e.g. at the capacitive pressure sensor).

The stress compensation described above may be used especially with standard packages, as these are typically not stress optimized.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The invention claimed is:

1. A micromechanical semiconductor pressure sensing device comprising:

a movable diaphragm above a hollow space, wherein the diaphragm is part of a capacity configured to yield an electrical sensing signal in response to a pressure acting on the diaphragm, wherein a piezoresistive sensing device is buried in the diaphragm, the piezoresistive sensing device being configured to sense a mechanical stress disturbing the electrical sensing signal and being configured to yield an electrical disturbance signal.

2. The device according to claim 1, further comprising a compensation logic configured to compensate, based on the electrical disturbance signal, a disturbance in the electrical sensing signal caused by the mechanical stress.

3. A method for manufacturing a micromechanical semiconductor pressure sensing device, the method comprising:

structuring a movable diaphragm above a hollow space, wherein the diaphragm is part of a capacity configured to yield an electrical sensing signal in response to a pressure acting on the diaphragm, wherein a piezoresistive sensing device is buried in diaphragm, the piezoresistive sensing device being configured to sense a mechanical stress disturbing the electrical sensing signal and being configured to yield an electrical disturbance signal based on the sensed mechanical stress disturbing the electrical sensing signal.

* * * * *